(12) United States Patent
Roy et al.

(10) Patent No.: US 8,743,574 B2
(45) Date of Patent: Jun. 3, 2014

(54) EFFICIENT POWER CONVERSION FOR ULTRA LOW VOLTAGE MICRO SCALE ENERGY TRANSDUCERS

(75) Inventors: Kaushik Roy, West Lafayette, IN (US); Vijay Raghunathan, West Lafayette, IN (US); Chao Lu, West Lafayette, IN (US); Sang Phill Park, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 600 days.

(21) Appl. No.: 13/045,441

(22) Filed: Mar. 10, 2011

(65) Prior Publication Data

US 2011/0260536 A1    Oct. 27, 2011

Related U.S. Application Data

(60) Provisional application No. 61/312,557, filed on Mar. 10, 2010.

(51) Int. Cl.
*H02M 3/18* (2006.01)
*H02M 7/00* (2006.01)

(52) U.S. Cl.
USPC .............................................. 363/59; 363/60

(58) Field of Classification Search
USPC ..................................................... 363/59, 60
See application file for complete search history.

(56) References Cited

U.S. PATENT DOCUMENTS

| 6,198,645 | B1 * | 3/2001 | Kotowski et al. ............... 363/59 |
| 6,563,235 | B1 * | 5/2003 | McIntyre et al. ............. 307/109 |
| 7,518,892 | B2 * | 4/2009 | Kitagawa et al. ............... 363/59 |
| 7,851,946 | B2 * | 12/2010 | Oyama et al. ................... 363/60 |
| 8,295,064 | B2 * | 10/2012 | Shiwaya .......................... 363/60 |

OTHER PUBLICATIONS

Tsui et al., Jun. 2005, IEEE, 2005 Symposium on VLSI Circuits Design for Technical Pagers, 2005, pp. 316-319.*
B. Atwood et al., "Preliminary circuits for smart dust", Southwest Symposium on Mixed Signal Design, pp. 87-92, 2000.
R. F. Yazicioglu et al., "Ultra-low-power biopotential interfaces and their applications in wearable and implantable systems", Microelectronics Journal, vol. 40, No. 9, pp. 1313-1321, 2009.
L. Mateu et al., "Review of energy harvesting techniques and applications for microelectronics", SPIE Microtechnologies for the New Millennium, pp. 359-373, 2005.
V. Raghunathan et al., "Design and Power Management of Energy Harvesting Embedded Systems", ACM/IEEE International Symposium on Low Power Electronics and Design (ISLPED), pp. 369-374, Oct. 2006.
L. Mateu et al., "Energy harvesting for wireless communication systems using thermogenerators," Conference on Design of Circuits and Integrated Systems (DCIS), 2006.
K. L. Chu et al. "A nanoporous silicon membrane electrode assembly for on-chip micro fuel cell applications", Journal of Microelectromechanical Systems, vol. 15, iss. 3, pp. 671-677, 2006.

(Continued)

*Primary Examiner* — Jue Zhang
(74) *Attorney, Agent, or Firm* — Faegre Baker Daniels LLP

(57) ABSTRACT

A power converter is provided for an energy harvesting system of a micro-scale electronic device. The power converter is configured to transfer electrical energy from an energy transducer to an energy storage device. The power converter illustratively includes a tree topology charge pump.

14 Claims, 14 Drawing Sheets

(56) References Cited

OTHER PUBLICATIONS

J. W. Kimball et al., "Issues with low input-voltage boost converter design", Power Electronics SpecialistsConference, vol. 3, pp. 2152-2156, 2004.

Dickson J. F., "On-Chip high voltage generation in MNOS integrated circuits using an improved voltage multiplier technique", IEEE J. SolidState Circuits, vol. SC-11, No. 3, pp. 374-378, Jun. 1976.

F. Su et al., "Gate control strateies for high efficiency charge pumps", IEEE International Symposium on Circuits and Systems (ISCAS), pp. 1907-1910, 2005.

F. Pan et al., Charge Pump Circuit Design, McGraw-Hill Professional, Jun. 2006.

H. Shao, et al., "A micro power management system and maximum output power control for solar energy harvesting applications", ACM/IEEE International Symposium on Low Power Electronics and Design (ISLPED), pp. 298-303, 2007.

P. Favrat et al., "A high-efficiency CMOS voltage doubler", IEEE J. Solid State Circuits, vol. 33, No. 3, pp. 410-416, 1998.

T. Ying et al., "Area-efficient CMOS charge pumps for LCD drivers", IEEE J. Solid State Circuits, vol. 38, No. 10, pp. 1721-1725, 2003.

C.Y. Tsui et al., "Ultra-low voltage power management circuit and computation methodology for energy harvesting applications", ACM/IEEE Asia and South Pacific Design Automation Conference (ASP-DAC), pp. 96-97, 2006.

D. Brunelli et al., "An efficient solar energy harvester for wireless sensor nodes", ACM/IEEE Design, Automation, and Test in Europe (DATE), pp. 104-109, 2008.

Solar world Inc., http://www.solar-world.com/, as captured from Internet Archive Wayback Machine with an indicated date of Jun. 16, 2009, 3 pages.

Micropelt Inc., http://www.micropelt.com/, as captured from Internet Archive Wayback Machine with an indicated date of Feb. 18, 2009, 2 pages.

Mypelt simulation tool., www.micropelt.com/products/mypelt.php, as captured from Internet Archive Wayback Machine with an indicated date of Apr. 2, 2009, 6 pages.

* cited by examiner

EFFICIENT POWER CONVERSION FOR ULTRA LOW VOLTAGE MICRO SCALE ENERGY TRANSDUCERS

CROSS REFERENCE TO RELATED APPLICATION

This application claims the benefit of U.S. Provisional Patent Application Ser. No. 61/312,557, filed Mar. 10, 2010, the disclosure of which is expressly incorporated by reference herein.

FIELD

The present disclosure relates to an energy harvesting system, and more particularly to a charge pump of an energy harvesting system having a tree topology.

BACKGROUND AND SUMMARY

Advances in micro-scale and nano-scale integration have resulted in a new class of miniaturized electronic systems, such as smart dust sensors, wireless sensor nodes, and bio-medical implants that enable new application domains. Despite constraints on size and hence battery capacity, these systems are often required to operate for several months or even years without the need for battery replacement. This is often due to the expense and/or infeasibility of frequent battery replacement. Environmental energy harvesting has emerged as an option to alleviate the energy supply challenge in these systems and to improve battery lifetime. Energy harvesting provides self-powered system operation.

Environmental energy harvesting has been explored and applied at the macro-scale in the context of large systems such as solar farms, windmills, and hydro-generators. However, a micro-scale energy harvesting subsystem for miniaturized electronic device involves different challenges. For example, the form-factor constraint in these systems mandates the use of small or miniature energy transducers. As a result, the output voltage of the transducer is typically low, such as less than 1V. For example, miniature single junction photovoltaic (PV) cells and thermo-electric generators (TEG) typically produce voltages in the range of 0.2V to 0.6V. Other energy sources, such as micro-fuel cells, also produce low voltages. Further, the maximum power output of micro-scale transducers is small, often only a few milliwatts. As such, the harvesting subsystem is designed to extract as much power as possible from the transducer and to transfer the extracted power to the electronic system. Multiple energy transducer modules may be connected in series or in parallel to generate higher output voltage. However, such a stacked arrangement is limited due to size, cost, and packaging considerations.

One component of a micro-scale energy harvesting subsystem is a power converter that boosts the output voltage of the energy transducer to a suitable level to enable energy storage in an energy buffer, such as a rechargeable battery, an ultra-capacitor, or another suitable storage device. The power converter is implemented using an inductive boost converter or a charge pump. Boost converters require an external bulky inductor, leading to an increase in system cost and size. Charge pumps include capacitors and metal oxide semiconductor (MOS) switches configured in a single- or multi-stage linear topology. The charge transfer capability of linear charge pumps is subject to degradation when used with ultra-low voltage energy transducers.

In one illustrated embodiment of the present disclosure, an energy harvesting system is provided for a micro-scale electronic device. The system includes an energy transducer configured to produce electrical energy. The energy transducer has an output configured to supply a first voltage. The system also includes an energy storage device configured to store electrical energy, and a power converter configured to transfer electrical energy from the transducer to the energy storage device. The power converter includes a charge pump coupled between the energy transducer and the energy storage device and a control unit configured to control operation of the charge pump. The charge pump includes a first stage, a second stage, and a third stage. Each of the first and second stages have an output and at least one input coupled to the output of the transducer so that the transducer supplies the first voltage to the at least one input of the first and second stages. The first and second stages of the charge pump provide second and third voltages at their outputs, respectively, the second and third voltages being greater than the first voltage. The outputs of the first and second stages are coupled to first and second inputs of the third stage of the charge pump and an output of the third stage supplies a fourth voltage to the energy storage device. The fourth voltage is greater than the second and third voltages.

In another illustrated embodiment of the present disclosure, a power converter is provided for an energy harvesting system of a micro-scale electronic device. The power converter is configured to transfer electrical energy from an energy transducer to an energy storage device. The power converter includes a control unit configured to provide at least one clocking signal, and a charge pump coupled to the control unit. The charge pump includes a first stage, a second stage, and a third stage. The first stage of the charge pump includes first and second inputs, the first input of the first stage being coupled to a first plate of a first capacitor through a first switch, and the second input of the first stage being coupled to a second, opposite plate of the first capacitor through a second switch, the first plate of the first capacitor also being coupled to a third switch which is also coupled to an output of the first stage. The second stage of the charge pump includes first and second inputs, the first input of the second stage being coupled to a first plate of a second capacitor through a fourth switch, and the second input of the second stage being coupled to a second, opposite plate of the second capacitor through a fifth switch, the first plate of the second capacitor also being coupled to a sixth switch which is also coupled to an output of the second stage. The third stage of the charge pump includes first and second inputs, the first input of the third stage being coupled to a first plate of a third capacitor, and the second input of the third stage being coupled to a second, opposite plate of the third capacitor, the first plate of the third capacitor also being coupled to a seventh switch which is also coupled to an output of the third stage. An output from the energy transducer is coupled to the first and second inputs of the first and second stages of the charge pump and the outputs of the first and second stages are coupled to the first and second inputs, respectively, of the third stage of the charge pump. An output of the third stage is coupled to the energy storage device. The at least one clocking signal from the control unit is coupled to the first, second third, fourth, fifth, and sixth switches to control operation of the charge pump so that voltages at the outputs of the first and second stages are greater than the voltage supplied by the energy transducer and a voltage at the output of the third stage is greater than the voltages at the outputs of the first and second stages.

In one illustrated embodiment, the second plate of the first capacitor is coupled through an eighth switch to ground, the second plate of the second capacitor is coupled through a ninth switch to ground, and the second plate of the third capacitor is coupled through a tenth switch to ground. In an illustrated embodiment, the control unit generates first and second non-overlapping clocking signals. The first clocking signal is supplied to the first, fifth, sixth, and eighth switches, and the second clocking signal being supplied to the second, third, fourth, seventh, ninth, and tenth switches to control operation of the charge pump.

In yet another illustrated embodiment of the present disclosure, a method for supplying power from an energy transducer to an energy storage device includes providing a charge pump including a first stage, a second stage, and a third stage; supplying a voltage source from the energy transducer to at least one input of the first and second stages of the charge pump; and increasing the voltage received from the voltage source in the first and second stages of the charge pump in parallel. The method also includes supplying output voltages from the first and second stages to first and second inputs of the third stage of the charge pump; increasing the voltage in the third stage compared to the output voltages of the first and second stages; and supplying the increased voltage from the third stage to the energy storage device.

BRIEF DESCRIPTION OF THE DRAWINGS

The above-mentioned and other features and advantages of the invention, and the manner of attaining them, will become more apparent and the disclosure itself will be better understood by reference to the following description taken in conjunction with the accompanying drawings, wherein.

Corresponding reference characters indicate corresponding parts throughout the several views. The exemplifications set out herein illustrate exemplary embodiments of the invention, and such exemplifications are not to be construed as limiting the scope of the invention in any manner.

DETAILED DESCRIPTION

Figure 1:
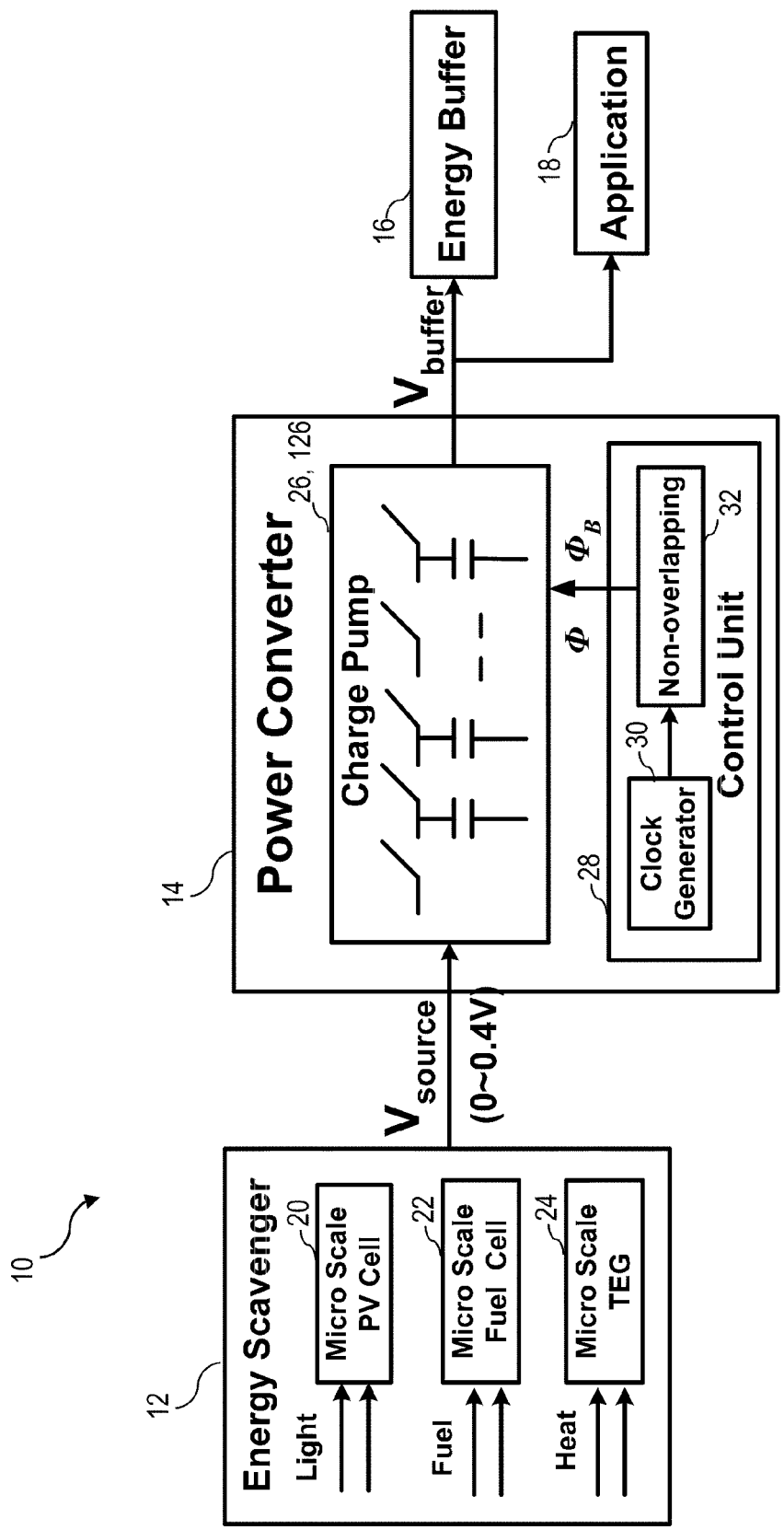
FIG. 1 is an illustrative view of an exemplary energy harvesting system of the present disclosure.

For the purposes of promoting an understanding of the principles of the present disclosure, reference will now be made to the embodiments illustrated in the drawings, which are described below. The embodiments disclosed below are not intended to be exhaustive or limit the present system to the precise form disclosed in the following detailed description. Rather, the embodiments are chosen and described so that others skilled in the art may utilize their teachings. Therefore, no limitation of the scope of the claimed present system is thereby intended. The present system includes any alterations and further modifications of the illustrated devices and described methods and further applications of the principles of the present system which would normally occur to one skilled in the art to which the present system relates.

Referring initially to FIG. 1, an exemplary energy harvesting system 10 is illustrated. Energy harvesting system 10 includes an energy scavenger 12, a power converter 14, an energy buffer 16, and an application unit 18. Application unit 18 may include any device or system, such as a biomedical device or a wireless sensor node, configured to use energy from energy buffer 16. Energy buffer 16 may include a rechargeable battery, a capacitor, or another suitable storage device. Energy scavenger 12 harvests energy from the environment to produce a voltage. In the illustrated embodiment, energy scavenger 12 includes at least one energy transducer configured to produce an unregulated low voltage. In an illustrated embodiment, the energy scavenger 12 includes one or more of a photovoltaic (PV) cell 20, a fuel cell 22, and a thermo-electric generator (TEG) 24. PV cell 20 is configured to convert light into electrical energy. Fuel cell 22 is configured to convert energy from a fuel into electrical energy. TEG 24 is configured to convert heat or temperature differences into electrical energy.

The low voltage output from the transducers of energy scavenger 12 is supplied to power converter 14, as illustrated with $V_{source}$. In the illustrated embodiment, $V_{source}$ ranges from about 0 V to 0.4 V, although other voltages may be produced with energy scavenger 12. Power converter 14 includes a charge pump 26, 126 coupled to and controlled by a control unit 28. In one embodiment, charge pump 26, 126 has a high conversion ratio configured to step up the voltage provided by the energy scavenger 12 and to transfer the harvested charge to energy buffer 16 for use by application unit 18.

Control unit 28 provides a switching frequency for driving charge pump 26. In illustrated embodiments, a clock generator 30 in control unit 28 is implemented as a ring oscillator or an analog voltage controlled oscillator. A non-overlapping block 32 in FIG. 1 provides non-overlapped clock signals ($\Phi$ and $\Phi_B$) to reduce the likelihood of a reverse current in charge pump 26, 126. See, for example, non-overlapping clock signals Φ and $Φ_B$ illustrated in FIGS. 5 and 7 where one clock signal is high when the other clock signal is low. In the illustrated embodiment, energy previously stored in energy buffer 16 enables the initial start-up of charge pump 26, 126. Energy buffer 16 also serves as a power supply for control unit 28.

Figure 2:
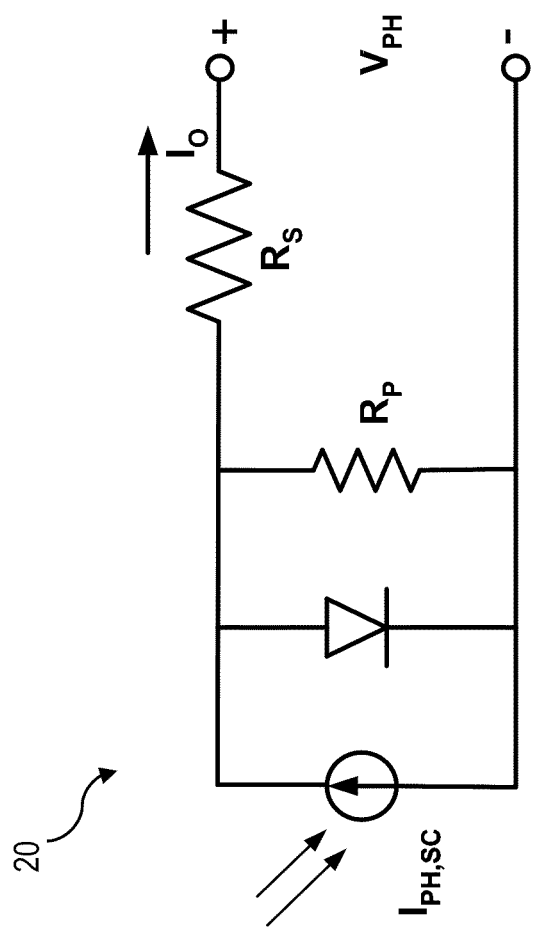
FIG. 2 illustrates an exemplary electric model of a photovoltaic cell.

Referring to FIG. 2, an exemplary non-stacked PV cell 20 is illustrated. PV cell 20 generates photocurrent $I_{PH,SC}$ that varies with light irradiance. The illustrated model of PV cell 20 includes parasitic serial resistance $R_S$ and an equivalent shunt resistance $R_P$. The output current and output voltage of PV cell 20 is illustratively $I_o$ and $V_{PH}$, respectively. An exemplary non-stacked PV cell 20 is Model No. 1-100 available from Solar World Inc., the specifications of which are incorporated herein by reference.

Figures 3A, 3B:
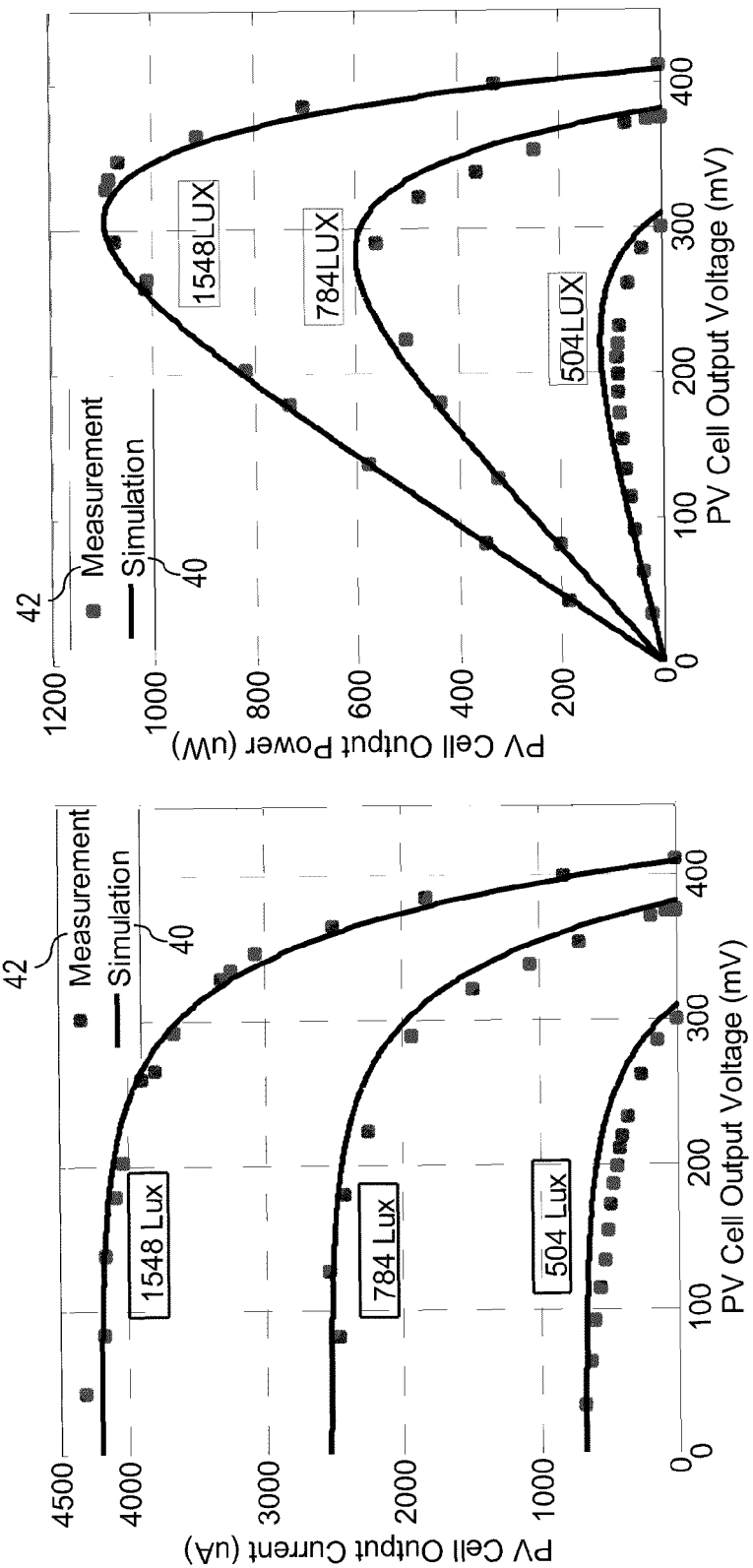
FIG. 3a illustrates exemplary output current of the photovoltaic cell of FIG. 2 as a function of output voltage.
FIG. 3b illustrates exemplary output power of the photovoltaic cell of FIG. 2 as a function of output voltage.

Exemplary current-voltage (I-V) characteristics (in microamps and millivolts) of PV cell 20 are illustrated in FIG. 3a, and exemplary power-voltage characteristics (in microwatts and millivolts) of PV cell 20 are illustrated in FIG. 3b. Simulated curves 40 are representative of the characteristics of PV cell 20 based on the electric model of FIG. 2, and measurements 42 are representative of exemplary physical measurements obtained with an actual PV cell 20. In FIGS. 3a and 3b, measurements 40 are obtained by illuminating PV cell 20 with a 40-Watt lamp while adjusting a distance between the lamp and PV cell 20 to represent variable light conditions. For example, FIGS. 3a and 3b illustrate measured I-V and output power characteristics of PV cell 20 at 504 illuminance (lux), 784 lux, and 1548 lux. Measurements 42 of FIGS. 3a and 3b also illustrate the connection of various resistive loads to PV cell 20. Referring to FIG. 3a, the output voltage and current of PV cell 20 illustrate that PV cell 20 behaves as a voltage limited current source, consistent with the electrical model of PV cell 20 illustrated in FIG. 2. Further, as illustrated in FIGS. 3a and 3b, the output voltage of PV cell 20 is low (less than about 0.42V) even for high irradiance. FIG. 3b plots the output power of PV cell 20 as a function of the output voltage and shows that, for any given light intensity, there is an optimal PV cell voltage where the output power is maximized. Further, the power output from PV cell 20 is small (mostly less than about 1 mW).

Figure 4B:
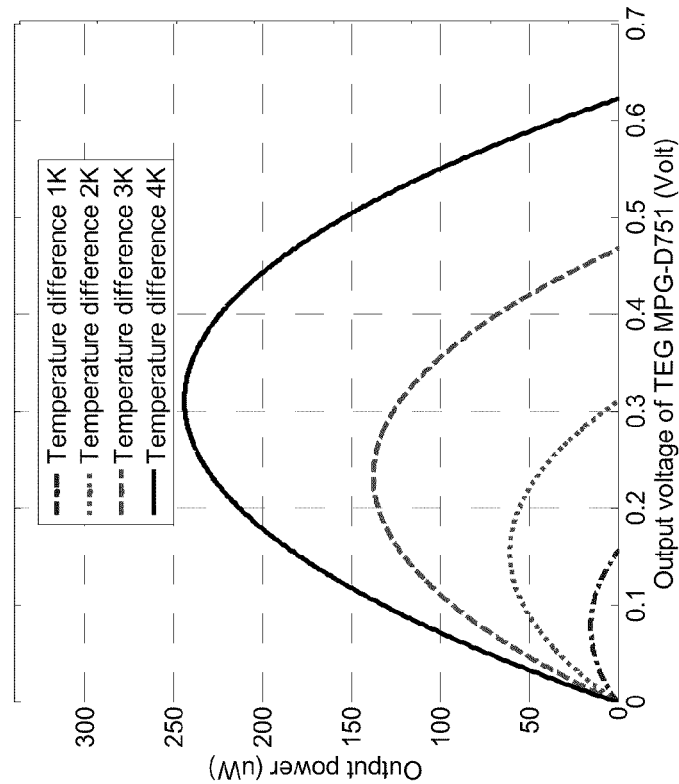
FIG. 4b illustrates exemplary output power of a thermoelectric generator as a function of output voltage.
Figure 4A:
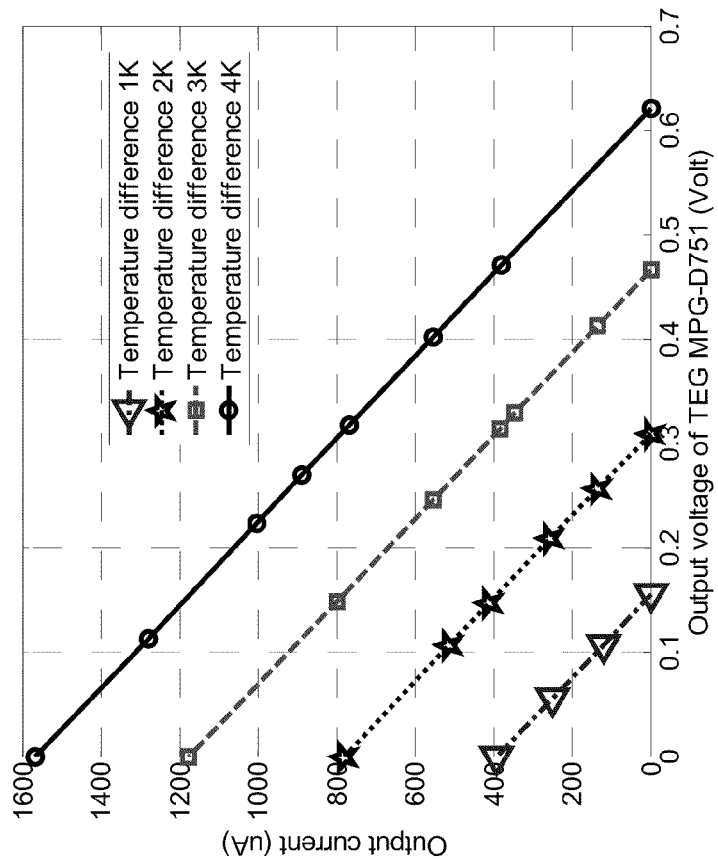
FIG. 4a illustrates exemplary output current of a thermoelectric generator as a function of output voltage.

Thermoelectric generators 24 (see FIG. 1) illustratively include multiple couples of p-type and n-type thermoelectric legs, which output electrical energy by employing the temperature gradient between a hot surface (for example, the human body) and a cold surface (for example, the ambient air). An exemplary TEG 24 is Model No. MPG-D751 available from Micropelt, the specifications of which are incorporated by reference herein. FIGS. 4a and 4b illustrated exemplary current and output power values as a function of voltage for various temperature differences ΔT (illustratively 1 Kelvin (K), 2 K, 3 K, and 4 K) across TEG 24. The output power varies as a function of output voltage for different ΔT, as illustrated in FIG. 4b. In the illustrated embodiment, the output voltage of TEG 24 is in the range of 0 V to about 0.6 V and the maximum power output is around 0.25 mW.

Figure 5:
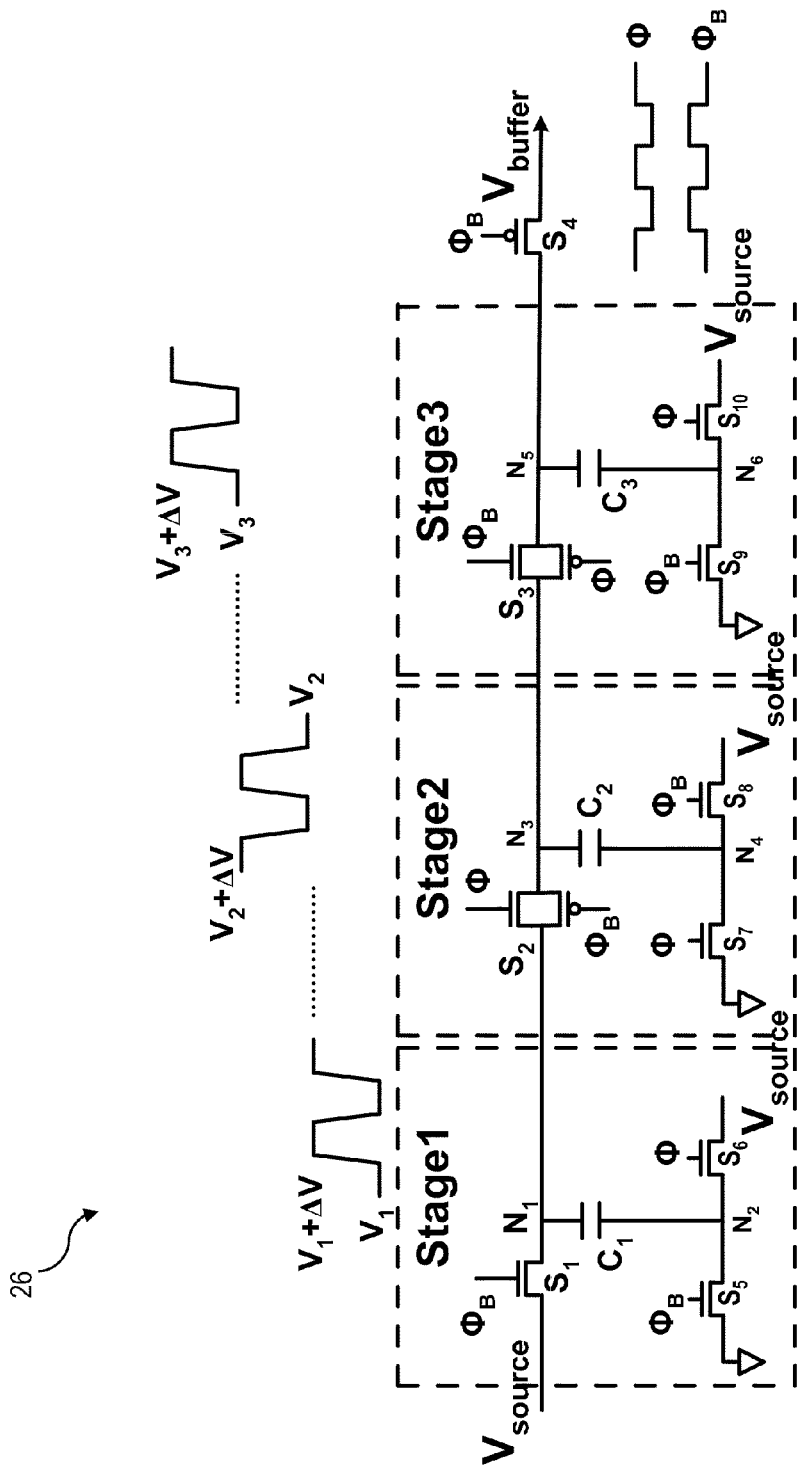
FIG. 5 is a schematic view of an exemplary prior art linear charge pump having three stages.

Referring to FIG. 5, an exemplary prior art charge pump 26 is illustrated. Charge pump 26 is illustratively a three-stage linear charge pump 26 having an ideal voltage step up ratio of four-to-one, i.e., a four-times step-up of the input voltage. Linear charge pump 26 is configured to transfer harvested current from an ultra low voltage energy scavenger 12 to energy buffer 16. During each clock cycle, the charge provided from a previous stage of charge pump 26 is stored on a capacitor in the current stage and is then transferred to a subsequent stage. For example, the charge provided from Stage 1 is stored on capacitor $C_2$ of Stage 2 before being transferred to Stage 3. At the final stage (illustratively Stage 3), the harvested charge from energy scavenger 12 is dumped into energy buffer 16 for storage.

Each stage of charge pump 26 includes several switches controlled with the switching frequency provided with control unit 28. The switches illustratively comprise metal oxide semiconductor (MOS) transistors or MOSFETs. See, for example, switches $S_1$ through $S_{10}$ of FIG. 5. Switches $S_2$ through $S_3$ are illustratively comprised of two MOS transistors. Each MOS transistor of switches $S_1$ through $S_{10}$ includes a source, drain, and gate and is configured to switch on upon the voltage at the gate exceeding a threshold value. The non-overlapping switching frequencies Φ and $Φ_B$ produced with control unit 28 are illustratively provided at the gate of each MOS transistor to switch the transistors on and off.

The average output current from 3-stage linear charge pump 26 is represented as:

$$I_{CP,O} = f_{clk} Q_{avg} = \frac{1}{3} C f_{clk} (4 V_{source} - V_{buffer}) \qquad (1)$$

wherein $I_{CP,O}$ is the average output current of three-stage linear charge pump 26, $f_{clk}$ is the switching frequency provided with control unit 28, $Q_{avg}$ is the average output charge transferred to energy buffer 16, C is the capacitance of capacitor $C_3$, $V_{source}$ is the input voltage provided with scavenger 12, and $V_{buffer}$ is the voltage of energy buffer 16. In one embodiment, each capacitor $C_1$, $C_2$, $C_3$ is the same size and thus has the same capacitance C.

Figure 6:
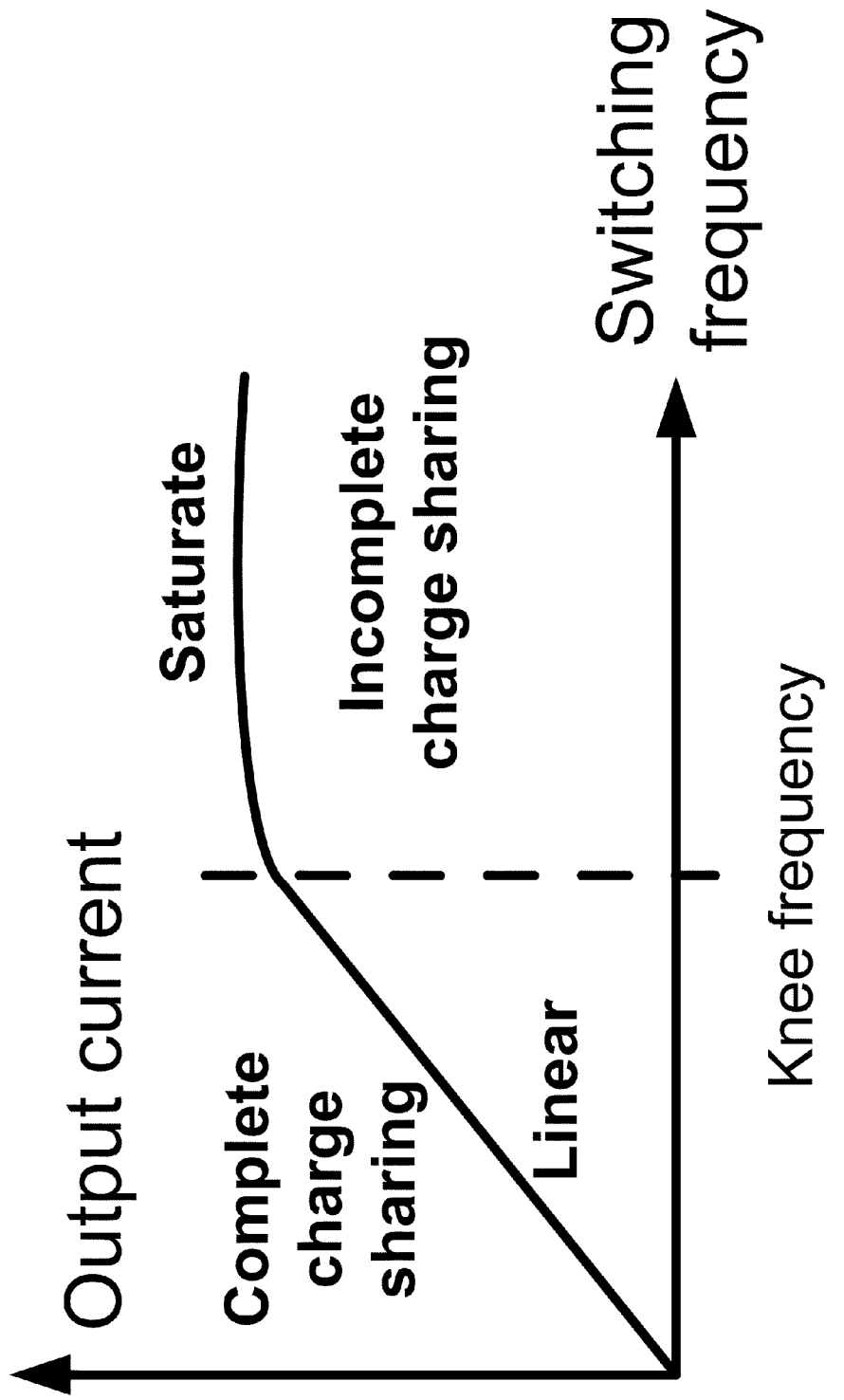
FIG. 6 illustrates exemplary output current of the prior art linear charge pump of FIG. 5 as a function of an applied switching frequency.

Equation (1) is derived based on the assumption that complete charge sharing is guaranteed within each clock cycle. In other words, Equation (1) assumes that the charge provided at each node ($N_1$, $N_2$, $N_3$) is completely transferrable to the subsequent stage or buffer within one period of the switching frequency. Equation (1) reveals a linear relationship between the charge pump output current $I_{CP,O}$ and switching frequency $f_{clk}$ when the capacitor (C), scavenger voltage ($V_{source}$) and energy buffer voltage ($V_{buffer}$) are constant. As illustrated in FIG. 6, when the clock switching frequency $f_{clk}$ is low, the output current $I_{CP,O}$ varies linearly with the applied clock frequency $f_{clk}$. However, when the switching frequency $f_a$ increases beyond a certain threshold value, the charge sharing becomes incomplete due to saturation of the output current $I_{CP,O}$. The interface frequency between complete and incomplete charge sharing is illustrated as the "knee frequency." Hence, the linear relationship between output current $I_{CP,O}$ and switching frequency $f_{clk}$ does not hold beyond the knee frequency due to saturation of the output current $I_{CP,O}$.

Charge sharing allows charge to be redistributed between stages or nodes of a charge pump 26. For example, when two capacitors having different voltages are connected in parallel through a switch, charge flows from the high-voltage capacitor to the low-voltage capacitor until both capacitors reach the same voltage. The time required to complete the charge redistribution process is based on the charge sharing path. As such, the knee frequency is determined based on a time constant of the charge sharing path. Referring to charge pump 26 of FIG. 5, when the voltage across capacitor $C_1$ is higher than the voltage across $C_2$, and switch $S_2$ is closed, charge from capacitor $C_1$ will transfer to capacitor $C_2$ until the voltage across capacitors $C_1$ and $C_2$ are the same.

The knee frequency is an intrinsic property of a charge pump and is determined by the time constant of charge sharing paths within the charge pump. Three-stage linear charge pump 26 includes three charge sharing paths. The first charge sharing path is formed by $S_1$ and $C_1$, the second charge sharing path is formed by $S_2$ and $C_2$, and the third charge sharing path is formed by $S_3$ and $C_3$. The time constant is illustratively based on the on-resistance of the MOS transistors of charge pump 26, as described herein.

The MOS transistors in charge pump 26 are modeled as voltage-controlled switches with non-negligible on-resistance. The on-resistance of the MOS transistor is represented as:

$$R_{on} = \frac{1}{\mu C_{OX}\left(\frac{W}{L}\right)\left(V_{GS} - V_{TH} - \frac{1}{2}V_{DS}\right)} \quad (2)$$

$$= \frac{1}{\mu C_{OX}\left(\frac{W}{L}\right)\left[V_G - V_{TH} - \frac{1}{2}(V_S + V_D)\right]}$$

wherein $R_{on}$ is the resistance of the conducting path formed between the source and drain when the MOS transistor is switched "on," $\mu$ is the surface mobility of the transistor, $C_{ox}$ is the capacitance per unit area of gate oxide, W is the channel width of the transistor, L is the channel length of the transistor, $V_{GS}$ is the gate to source voltage, $V_{DS}$ is the drain to source voltage, $V_{TH}$ is the threshold voltage required at the gate to switch the transistor "on" (i.e., to create a conducting path between the drain and source of the MOS transistor), $V_G$ is the gate voltage, $V_S$ is the source voltage, and $V_D$ is the drain voltage. The sum of Vs+Vd affects the time constant of the charge sharing path configured to set the knee frequency of charge pump 26.

In the illustrated embodiment, linear charge pump 26 of FIG. 5 has a minimum on-resistance $R_{on}$ because the gate voltage ($V_G$) of each switch (i.e. transistor) utilizes the feeding voltage back from the energy buffer 16, as described herein. As a consequence, the minimized on-resistance $R_{on}$ improves the charge transfer capability of charge pump 26 of FIG. 5.

From Equation (2), a reduction in threshold voltage ($V_{TH}$) results in a smaller on-resistance $R_{on}$ as well as enhanced charge transfer capability. However, leakage current increases with the scaling down of threshold voltage. In some cases, leakage current increases exponentially when the threshold voltage is scaled down.

Equation (2) also reveals that the conduction resistance $R_{on}$ diminishes with a decrease in the combined transistor source voltage and drain voltage ($V_S+V_D$). The source voltage, drain voltage, and combined source and drain voltage ($V_S+V_D$) before charge sharing is summarized in Table 1 for each charge sharing path.

TABLE 1

Drain and source voltages before charge sharing

| Groups | Voltages before the charging sharing | | |
|---|---|---|---|
| | $V_S$ | $V_D$ | $V_S+V_D$ |
| $S_1$ and $C_1$ | $V_{source}$ | $V_{buffer} - 3V_{source}$ | $V_{buffer} - 2V_{source}$ |
| $S_2$ and $C_2$ | $2V_{source}$ | $V_{buffer} - 2V_{source}$ | $V_{buffer}$ |
| $S_3$ and $C_3$ | $3V_{source}$ | $V_{buffer} - V_{source}$ | $V_{buffer} + 2V_{source}$ |

The largest time constant, or largest $V_S+V_D$, of the charge sharing paths of charge pump 26 limits the knee frequency of the entire charge pump 26. For the three-stage linear charge pump 26, the largest $V_S+V_D$ is given by $V_{buffer}+2V_{source}$, as illustrated in Table 1. As a consequence, the charge sharing path formed with $S_3$ and $C_3$ bounds the maximum switching frequency $f_{clk}$ of linear charge pump 26 for complete charge sharing.

Figure 7:
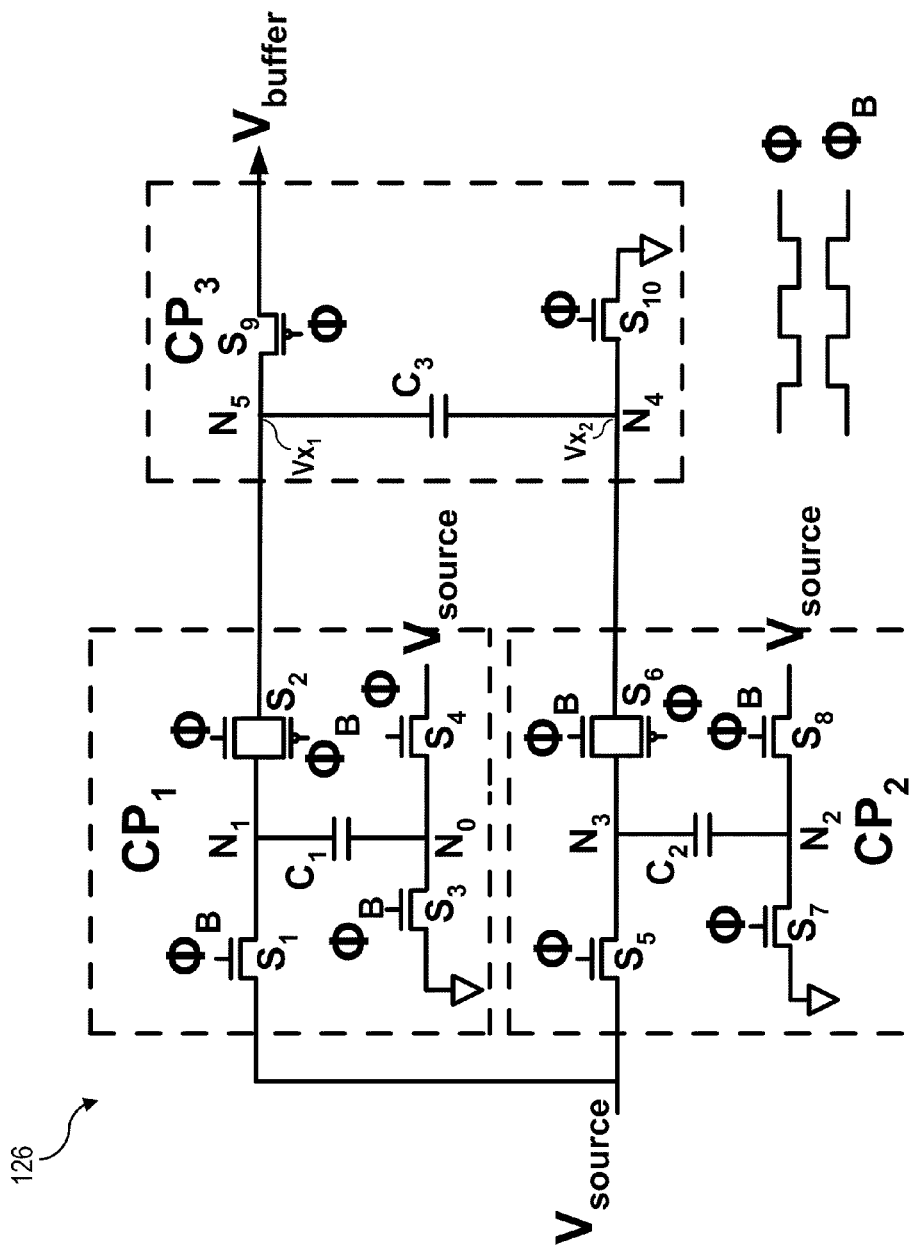
FIG. 7 illustrates a schematic view of an exemplary non-linear charge pump of the present disclosure having a tree topology.

Referring to FIG. 7, another exemplary charge pump 126 of the present disclosure is illustrated. Charge pump 126 is illustratively a non-linear, three-stage charge pump having a tree topology. As with charge pump 26 of FIG. 5, charge pump 126 is a four-times pump configured to step-up the input voltage by a factor of four. In the illustrated embodiment, charge pump 126 has improved charge transfer capability as compared with charge pump 26 of FIG. 5, as described herein. In one embodiment, the tree topology design of charge pump 126 is configured to provide a reduced charge sharing time, thereby leading to an improved charge transfer capability.

Charge pump 126 illustratively includes two front-end stages ($CP_1$ and $CP_2$) and a back-end stage ($CP_3$). In contrast with the linear three-stage configuration of charge pump 26 of FIG. 5, the outputs of front-end stages $CP_1$ and $CP_2$ are provided directly to the back-end stage $CP_3$. Front-end stages $CP_1$ and $CP_2$ operate to double the input voltage ($V_{source}$), and back-end stage $CP_3$ operates to double the already boosted voltages provided with front-end stages $CP_1$ and $CP_2$ to output a voltage that is substantially four times the input voltage $V_{source}$.

Each stage of charge pump 126 includes several switches controlled with the switching frequency provided with control unit 28. The switches illustratively comprise MOS transistors. See, for example, switches $S_1$ through $S_{10}$ of FIG. 7. Switches $S_2$ through $S_3$ are illustratively comprised of two MOS transistors. The non-overlapping switching frequencies $\Phi$ and $\Phi_B$ produced with control unit 28 are illustratively provided at the gate of each MOS transistor to switch the transistors on and off to control the charge sharing. Charge pump 126 further includes capacitors $C_1$, $C_2$, $C_3$. In one embodiment, capacitors $C_1$, $C_2$, $C_3$ all provide the same capacitance.

In operation, when switching frequency $\Phi$ is high in a first half of the clock cycle, the bottom plate of capacitor $C_3$ is discharged to zero due to a closed switch $S_{10}$. The top plate of capacitor $C_3$ is charged up by first stage $CP_1$ through a closed switch $S_2$. In other words, the voltage or charge at node $N_1$ provided by capacitor $C_1$ is transferred to capacitor $C_3$. At the end of the first half of the clock cycle, the voltages at nodes $N_1$ and $N_5$ are stable and are at the same value, assuming complete charge sharing occurs. The voltage at nodes $N_1$ and $N_5$ is denoted as $V_{X1}$ in FIG. 7.

In the second half of the clock cycle, switching frequency $\Phi$ is low and switch $S_2$ is open, and switching frequency $\Phi_B$ is high and switch $S_6$ is closed. Accordingly, phases $CP_1$ and $CP_3$ are isolated from each other, and phases $CP_2$ and $CP_3$ are in electrical communication. Further, node $N_4$ is charged up by second stage $CP_2$ through the closed switch $S_6$. Thus, at the end of the second half of the clock cycle, the voltages at nodes $N_3$ and $N_4$ are stable and are at the same value (denoted as voltage $V_{X2}$) assuming complete charge sharing occurs. Thus, the potential of node $N_5$ becomes $V_{X1}+V_{X2}$. If the potential at node $N_5$ is higher than the voltage at buffer 16 ($V_{buffer}$), the charge stored in capacitor $C_3$ in the first half of a clock cycle will be transferred to energy buffer 16 through a closed switch $S_9$. The charge sharing through switch $S_9$ ceases when the potential of node $N_5$ decreases to buffer voltage $V_{buffer}$.

Assuming that the switching frequency $f_{clk}$ is below the knee frequency, charge pump 126 provides complete charge sharing within the applied clock cycle. During each clock cycle, the amount of charge transferred to the energy buffer by the voltage doubler $CP_3$ is represented as:

$$Q_3 = C_3 V_{X1} - C_3(V_{buffer} - V_{X2}) = C(V_{X1} + V_{X2} - V_{buffer}) \quad (3)$$

wherein $Q_3$ is the charge transferred from $C_{P3}$ to energy buffer 16 and $C_3$ is the capacitance of the capacitor of $CP_3$. Similarly, the amount of charge transferred from $CP_1$ to $CP_3$ is represented as:

$$Q_1 = C_1 V_{source} - (V_{X1} - V_{source}) = C(2V_{source} - V_{X1}) \quad (4)$$

wherein $Q_1$ is the charge transferred from $C_{P1}$ to $C_{P3}$ and $C_1$ is the capacitance of the capacitor of $CP_1$. Thus, $CP_1$ provides twice the input voltage $V_{source}$ at node $N_1$, and the charge at node $N_1$ is configured to transfer to node $N_5$ until nodes $N_1$ and $N_5$ have reached the same voltage level.

Similarly, the amount of charge transferred from $CP_2$ to $CP_3$ is represented as:

$$Q_2 = C_2 V_{source} - C_2(V_{X2} - V_{source}) = C(2V_{source} - V_{X2}) \quad (5)$$

wherein $Q_2$ is the charge transferred from $C_{P2}$ to $C_{P3}$ and $C_2$ is the capacitance of the capacitor of $CP_2$. Thus, $CP_2$ provides twice the input voltage $V_{source}$ at node $N_3$, and the charge at node $N_3$ is configured to transfer to node $N_4$ until nodes $N_3$ and $N_4$ have reached the same voltage level.

For the backend stage $CP_3$ of charge pump 126, when charge $Q_3$ is being transferred to energy buffer 16, first stage $CP_1$ provides $Q_3$ amount of charge by direct charging (through a closed switch $S_2$) and second stage $CP_2$ provides $Q_3$ amount of charge to the bottom plate of capacitor $C_3$ (through a closed switch $S_6$). Hence, $Q_1 = Q_2 = Q_3$, from which we obtain the following:

$$V_{X1} = V_{X2} = (2V_{source} + C_{buffer})/3, \quad Q_3 = C(4V_{source} - V_{buffer})/3 \quad (6)$$

Accordingly, the output current flowing from charge unit 126 into energy buffer 16 is represented as:

$$I_{CP,O} = f_{clk} Q_3 = \frac{1}{3} f_{clk} C(4 V_{source} - V_{buffer}) \quad (7)$$

As illustrated with Equations (1) and (7), the derived output current equation for tree topology charge pump 126 of FIG. 7 is the same as the output current equation for linear charge pump 26 of FIG. 5. Hence, both topologies of charge pumps 26, 126 have the same charge transfer capability when the switching frequency $f_{clk}$ is low (i.e. at or below the knee frequency) and complete charge sharing is provided. However, as described herein, charge pump 126 of the present disclosure provides complete charge sharing at higher switching frequencies due to a reduced charge sharing time, thereby improving the charge transfer capability of charge pump 126 as compared with the prior art linear charge pump 26.

Non-linear charge pump 126 includes several charge sharing paths. A first charge sharing path is formed with $S_1$ and $C_1$, a second charge sharing path is formed with $S_5$ and $C_2$, and a third charge sharing path is formed with $S_2$ and $C_3$. As described herein, the knee frequency is determined by the time constant $(V_S + V_D)$ of charge sharing paths within the charge pump 126. The source voltage, drain voltage, and combined source and drain voltage $(V_S + V_D)$ before charge sharing is summarized in Table 2 for each charge sharing path of charge pump 126.

TABLE 2

Drain and source voltages before charge sharing

| Groups | Voltages before the charging sharing | | |
|---|---|---|---|
| | $V_S$ | $V_D$ | $V_S + V_D$ |
| $S_1$ and $C_1$ | $V_{source}$ | $V_{buffer} - 3V_{source}$ | $V_{buffer} - 2V_{source}$ |
| $S_5$ and $C_2$ | $V_{source}$ | $V_{buffer} - 3V_{source}$ | $V_{buffer} - 2V_{source}$ |
| $S_2$ and $C_3$ | $2V_{source}$ | $V_{buffer} - 2V_{source}$ | $V_{buffer}$ |

Figure 8:
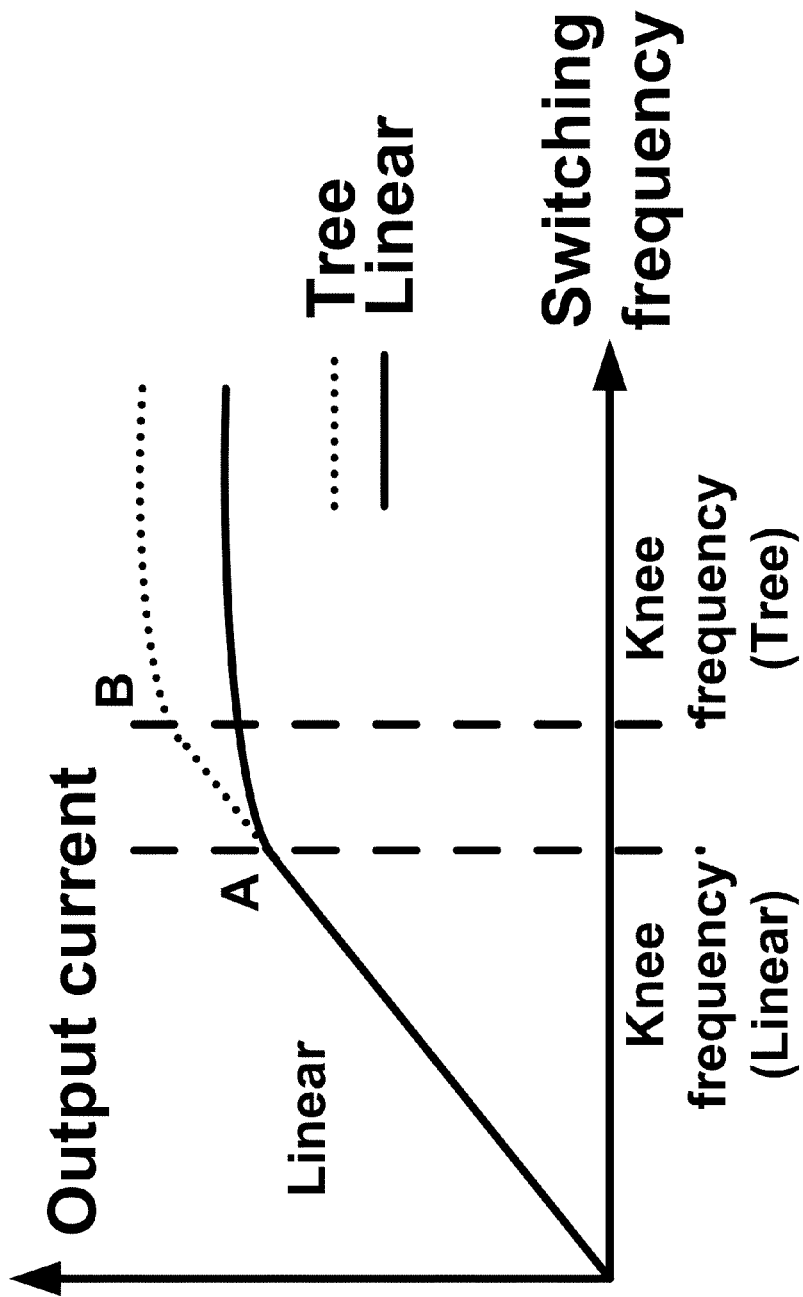
FIG. 8 illustrates a comparison of exemplary output current of the linear charge pump of FIG. 5 and the non-linear charge pump of FIG. 7 as a function of an applied switching frequency.

As described herein and as illustrated with Equation (2), the largest time constant, or largest $V_S + V_D$, of the charge sharing paths limits the knee frequency of the entire charge pump 126. Referring to Table 2, the largest time constant is $V_{buffer}$ provided in the charge sharing path of $S_2$ and $C_3$. As such, charge unit 126 has a relatively smaller $V_S + V_D$ as compared to the time constant $(V_S + V_D)$ of the prior art charge pump 26 of FIG. 5, resulting in a lower on-resistance $R_{on}$ of the charge sharing path and a higher knee frequency. Thus, the tree topology of charge pump 126 of the present disclosure allows complete charge sharing at higher switching frequencies as compared to the linear topology of the prior art charge pump 26. See, for example, the output current versus switching frequency illustrated in FIG. 8. In FIG. 8, charge pump 26 is represented by the solid line labeled "linear," and charge pump 126 is represented by the dashed line labeled "tree." As illustrated, the output currents of charge pumps 26, 126 coincide with each other at lower frequencies up until the knee frequency A of charge pump 26, and the knee frequency B of charge pump 126 is higher than the knee frequency A of linear charge pump 26.

As illustrated with Equations (1) and (7), the minimum input voltage $V_{source}$ required for normal operation (i.e., positive output current $I_{CP,O}$) of 4-times charge pumps is one-fourth of the energy buffer voltage $V_{buffer}$. When the input voltage $V_{source}$ is equal to or lower than $0.25V_{buffer}$, the charge pump 26, 126 is unable to harvest charge into the energy buffer 16, which reflects a loss of charge transfer capability.

The power harvesting efficiency of energy harvesting system 10 may be affected by other components of system 10. As illustrated in FIG. 1, charge pump 26, 126 operates with the help of control unit 28, which also consumes power from energy buffer 16. In order to calculate the effective harvested power of system 10, the power loss due to control unit 28 is deducted from the output power of charge pump 26, 126. In one embodiment, dynamic power consumption of control unit 28 dominates the total power loss due to control unit 28 and is represented as:

$$P_{dynamic} = C_L f_{clk} V_{buffer}^2 = V_{buffer}(C_L f_{clk} V_{buffer}) = V_{buffer} I_{loss} \quad (8)$$

wherein $P_{dynamic}$ is the dynamic power consumption of control unit 28 and $C_L$ is the effective loading capacitance of control unit 28. Thus, the average current loss $I_{loss}$ due to control unit 28 may be represented as:

$$I_{loss} = C_L f_{clk} V_{buffer} \quad (9)$$

Figure 9B:
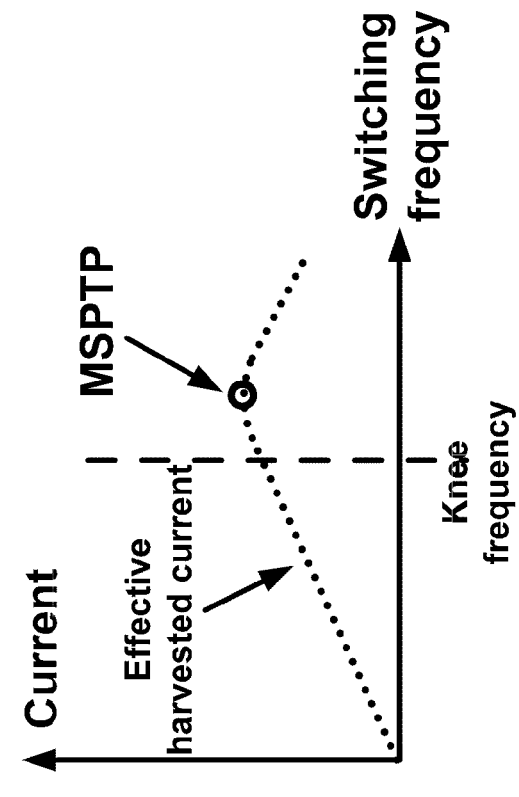
FIG. 9b illustrates exemplary effective harvested output current of the charge pump of FIG. 7 as a function of an applied switching frequency.
Figure 9A:
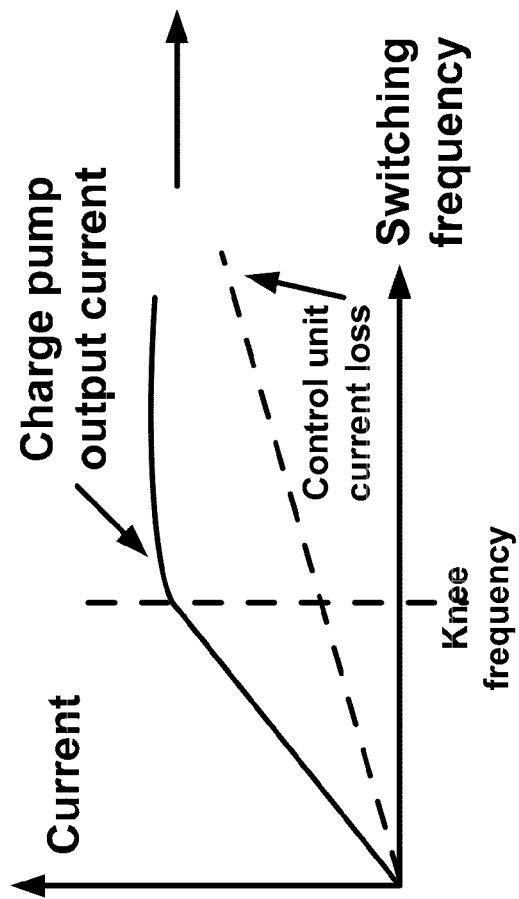
FIG. 9a illustrates exemplary charge pump output current and control unit current loss as a function of an applied switching frequency.

As illustrated with Equation (9) and in FIG. 9a, the current loss $I_{loss}$ linearly increases with the switching frequency $f_{clk}$ generated with control unit 28. Referring to FIG. 9a, the solid line represents the output current of charge pump 126, and the dashed line represents the current loss due to control unit 28. Referring to FIGS. 9a and 9b, when the switching frequency is below the knee frequency, the output current of charge pump 126 overwhelms the current loss of control unit 28, so the effective harvested output current (shown as the dashed line of FIG. 9b) increases linearly. When the applied switching frequency is above the knee frequency, the output current of charge pump 126 gradually saturates due to incomplete charge sharing. Since the current loss of control unit 28 increases linearly with switching frequency, the effective harvested output current will increase to a maximum system power transfer point (MSPTP) before decreasing, as shown in FIG. 9b. The MSPTP is illustratively at a higher frequency than the knee frequency. As such, application of a high switching frequency results in the current loss of control unit 28 exceeding the output current of charge pump 126, thereby negating the effect of harvesting.

Figure 10:
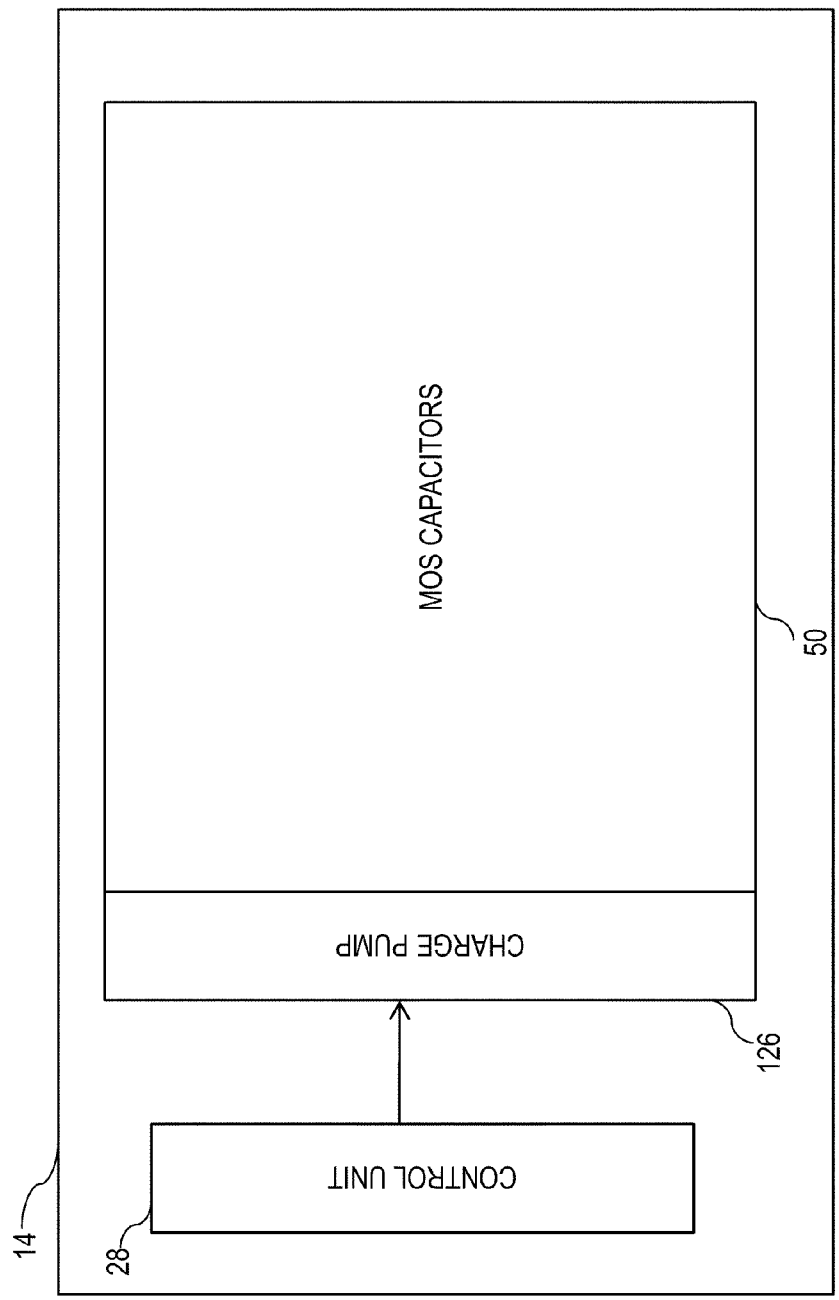
FIG. 10 illustrates an exemplary power converter of the energy harvesting system of FIG. 1 including a charge pump.

In one illustrative embodiment, charge pump 126 is implemented in complementary metal oxide semiconductor (CMOS) technology. See, for example, on-chip power converter 14 illustrated in FIG. 10. Power converter 14 of FIG. 10 includes control unit 28 coupled to charge pump 126. Power converter 14 further includes MOS gate capacitors 50. Capacitors 50 are configured to realize capacitors $C_1$, $C_2$, $C_3$ illustrated in FIG. 7. As illustrated, capacitors 50 forming $C_1$, $C_2$, $C_3$ are provided on-chip. In one embodiment, 500 pF MOS gate capacitors are provided in power converter 14. The dimensions of power converter 14 are illustratively about 680 μm×400 μm, although other suitable dimensions may be provided. Exemplary CMOS technology includes 65 nanometer IBM CMOS technology.

In one embodiment, the MOS transistors of charge pump 126 have a channel width to channel length ratio of about 200 μm to 60 nm. In one embodiment, energy buffer 16 is a rechargeable battery having a voltage fixed at about 1V.

Referring to FIGS. 11 through 14, exemplary characteristics of charge pumps 26, 126 are illustrated. As discussed herein, to achieve energy harvesting by a 4-times charge pump 26, 126, the input voltage $V_{source}$ may not be lower than one fourth of the energy buffer voltage $V_{buffer}$. In the illustrated embodiment of FIGS. 11 through 14, three input voltages (0.28V, 0.3V, and 0.33V) are used for simulating the output characteristics of charge pumps 26, 126. Further, the threshold voltage of each MOS transistor is about 0.43V, indicating that the input voltages of 0.28V, 0.3V, and 0.33V are sub-threshold voltages.

Figure 11:
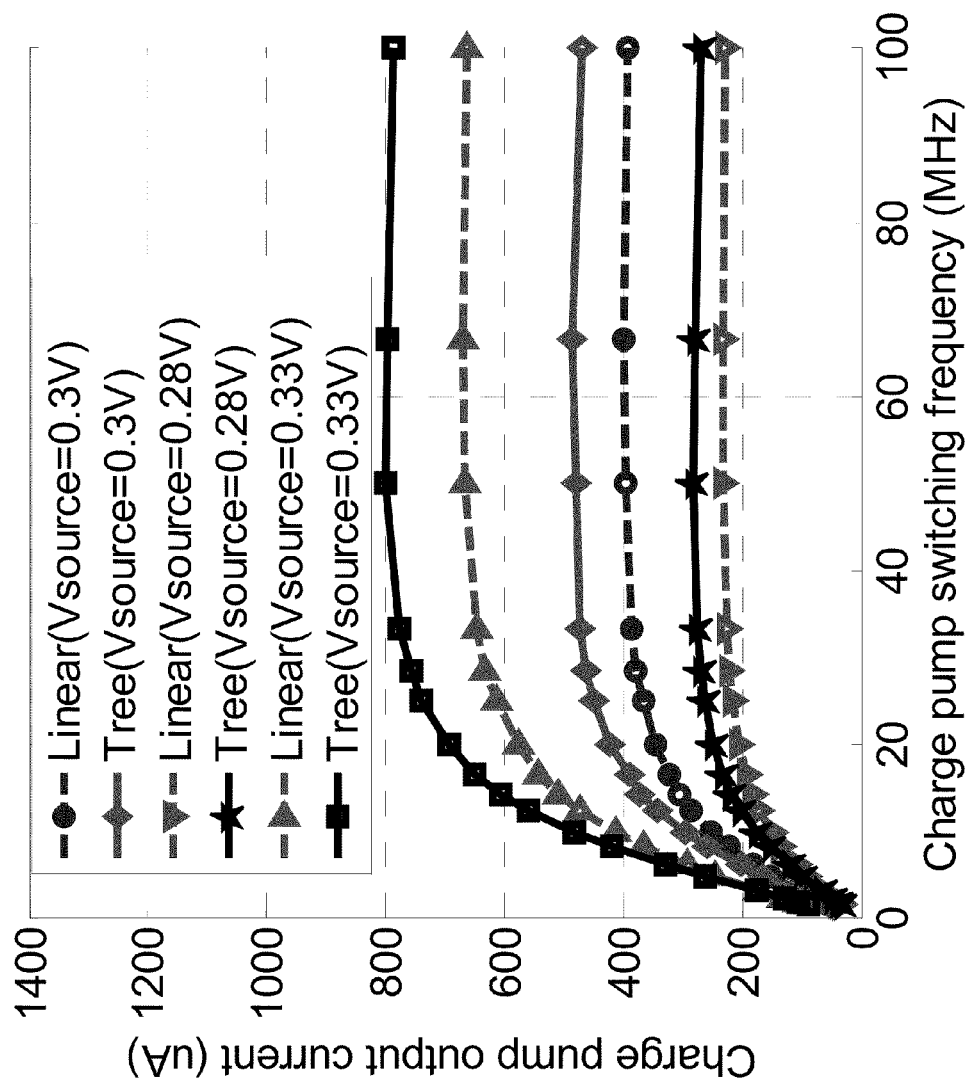
FIG. 11 illustrates a comparison of exemplary output currents of the charge pumps of FIGS. 5 and 7 as a function of switching frequency and source voltage.
Figure 12:
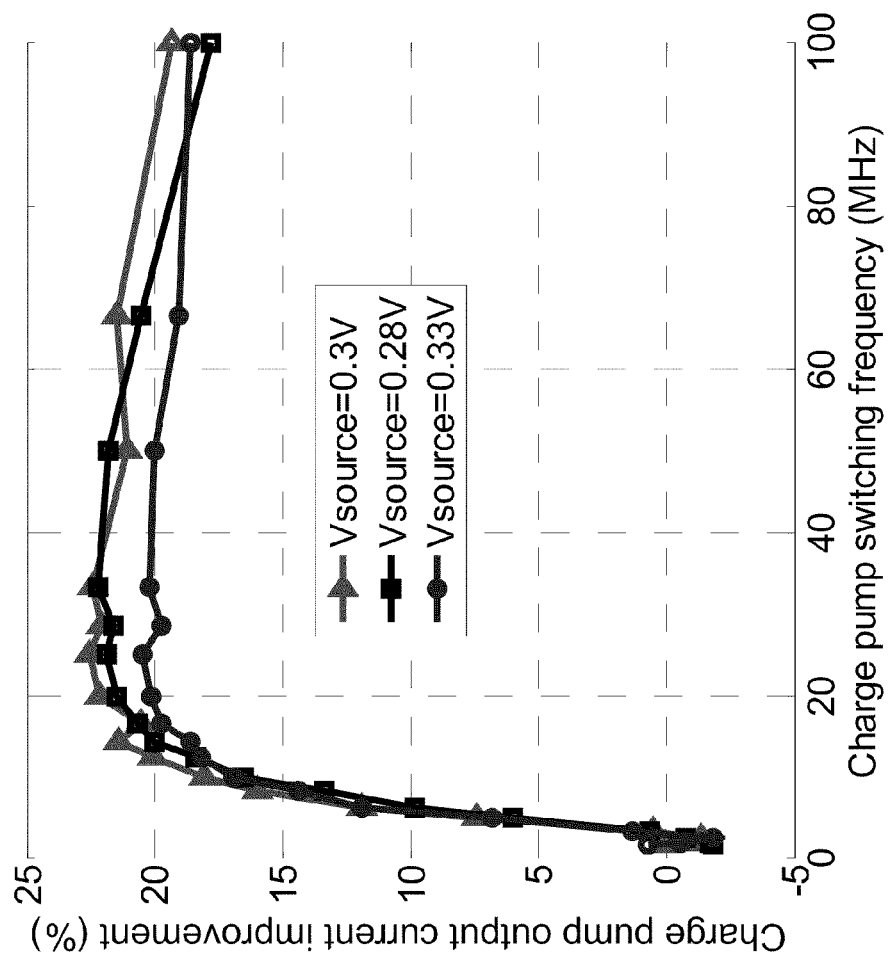
FIG. 12 illustrates an exemplary improvement percentage of the output current of the charge pump of FIG. 7 over the output current of the charge pump of FIG. 5 as a function of switching frequency and source voltage.

FIG. 11 illustrates the relationship between the switching frequency of charge pumps 26, 126 and the output current of pumps 26, 126. Charge pump 26 is represented by curves labeled "linear," and charge pump 126 of the present disclosure is represented by curves labeled "tree." When the switching frequency is in the range 1.66 MHz-3.33 MHz, both charge pumps 26, 126 provide complete charge sharing within the clock cycle. Further, the output current of each pump 26, 126 is proportional to the applied switching frequency, and both output currents of pumps 26, 126 have substantially similar values. As illustrated in FIG. 11, as the switching frequency increases beyond about 3.33 MHz, the output current of charge pump 126 is greater than the output current of charge pump 26 for each of the applied input voltages. FIG. 12 illustrates the percentage improvement of the output current of charge pump 126 as compared to charge pump 26. As illustrated in FIG. 12, when the switching frequency is greater than about 20 MHz, the output current of charge pump 126 is about 20% greater than the output current of charge pump 26.

Figure 13:
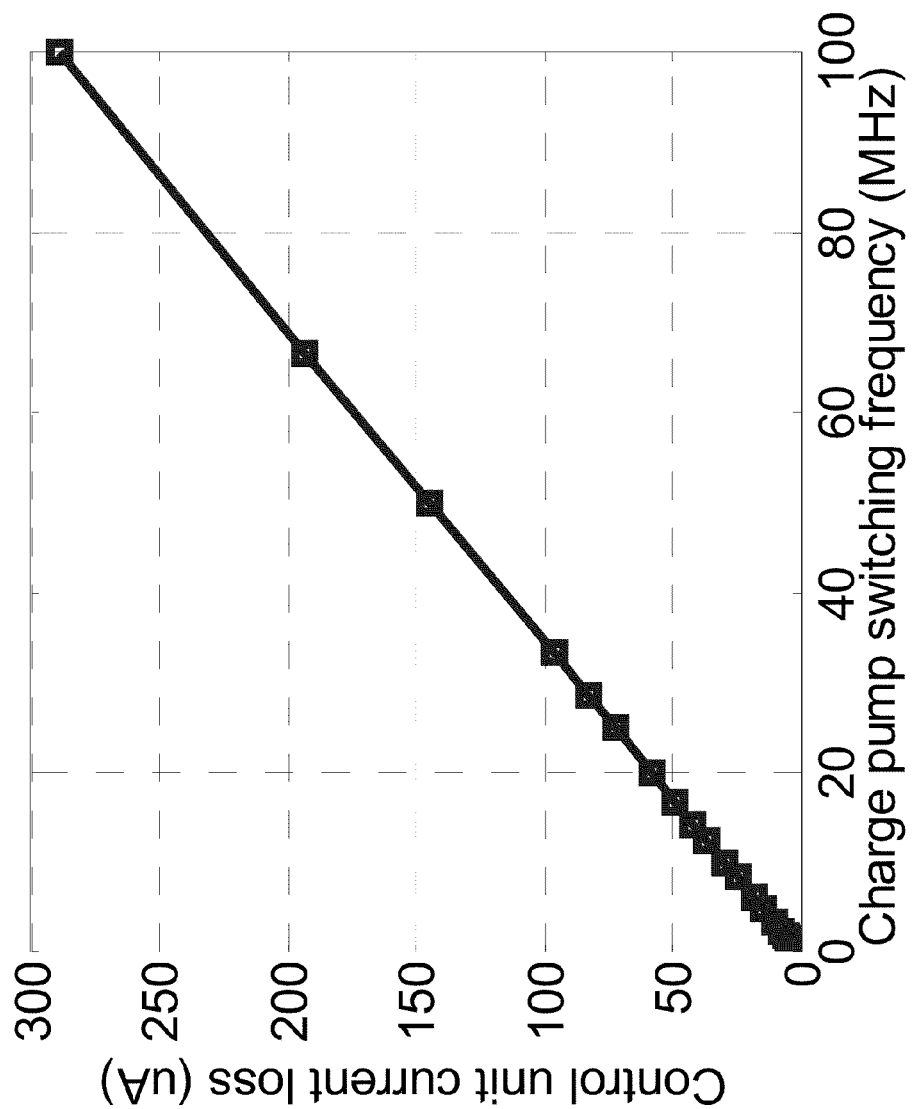
FIG. 13 illustrates an exemplary control unit current loss of the energy harvest system of FIG. 1 as a function of switching frequency.
Figure 14:
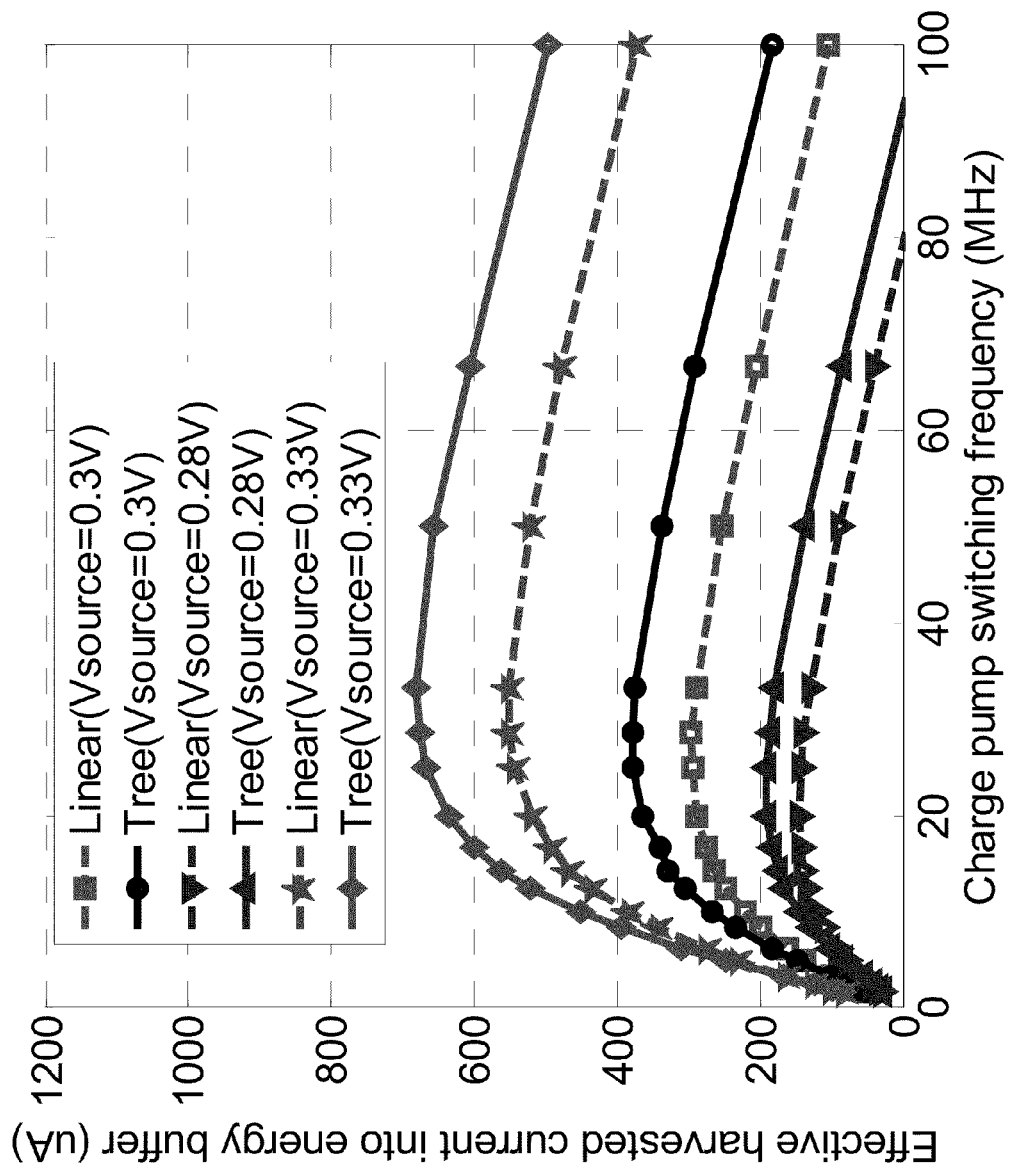
FIG. 14 illustrates a comparison of exemplary effective harvest output currents of the charge pumps of FIGS. 5 and 7 as a function of switching frequency and source voltage.

Referring to FIG. 13, an exemplary current loss of control unit 28 is illustrated as a function of the switching frequency. Referring to FIG. 14, the effective harvested current for charge pumps 26, 126 is illustrated while taking into account the current loss (see FIG. 13) of control unit 28. Prior Art charge pump 26 is represented by curves labeled "linear," and charge pump 126 of the present disclosure is represented by curves labeled "tree." The effective harvested current for each of the three exemplary input voltages 0.28V, 0.3V, and 0.33V is illustrated in FIG. 14. For example, when the input voltage is fixed at about 0.28V, the effective output current increases with increasing switching frequency and reaches a peak current level at around 20 MHz. Beyond this point, the effective output current drops due to current overhead resulting from extensive switching, as described herein.

Referring to Table 3 below, a summary is provided of exemplary maximum effective output current of the linear topology charge pump 26, exemplary maximum effective output current of the tree topology charge pump 126, and improvement percentages for the three input voltage levels (0.28 V, 0.30 V, 0.33 V). On average, the tree topology of charge pump 126 of the present disclosure illustratively provides about a 20-30% improvement in effective output current over the linear topology of the prior art charge pump 26. Further, based on the exemplary parameters of Table 3, the improvement percentage of the output current of charge pump 126 over charge pump 26 increases as the input voltage decreases.

TABLE 3

Maximum effective output current for the Linear and Tree topologies and the percentage improvement

| $V_{source}$ | Maximum effective output current (Linear) | Maximum effective output current (Tree) | Percentage Improvement |
|---|---|---|---|
| 0.28 V | 146.05 μA | 190.47 μA | 30.41% |
| 0.3 V | 295.39 μA | 378.79 μA | 28.23% |
| 0.33 V | 550.79 μA | 681.12 μA | 23.66% |

While this disclosure has been described as having exemplary designs and embodiments, the present system may be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains.

The invention claimed is:

1. An energy harvesting system for a micro-scale electronic device, the system comprising:
an energy transducer configured to produce electrical energy, the energy transducer having an output configured to supply a first voltage;
an energy storage device configured to store electrical energy; and
a power converter configured to transfer electrical energy from the transducer to the energy storage device, the power converter including a charge pump coupled between the energy transducer and the energy storage device and a control unit configured to control operation of the charge pump, the charge pump including a first stage, a second stage, and a third stage, each of the first and second stages having an output and at least one input coupled to the output of the transducer so that the transducer supplies the first voltage to the at least one input of the first and second stages, the first and second stages of the charge pump providing second and third voltages at their outputs, respectively, the second and third voltages being greater than the first voltage, the outputs of the first and second stages being coupled to first and second inputs of the third stage of the charge pump and an output of the third stage supplying a fourth voltage to the energy storage device, the fourth voltage being greater than the second and third voltages, wherein the first stage of the charge pump includes first and second inputs coupled to the output of the transducer, the first input of the first stage also being coupled to a first plate of a first capacitor through a first switch, and the second input of the first stage being coupled to a second, opposite plate of the first capacitor through a second switch, the first plate of the first capacitor also being coupled to a third switch which is also coupled to the output of the first stage, the second stage of the charge pump includes first and second inputs coupled to the output of the transducer, the first input of the second stage also being coupled to a first plate of a second capacitor through a fourth switch, and the second input of the second stage being coupled to a second, opposite plate of the second capacitor through a fifth switch, the first plate of the second capacitor also being coupled to a sixth switch which is also coupled to the output of the second stage, and the first input of the third stage is coupled to a first plate of a third capacitor, and the second input of the third stage is coupled to a second, opposite plate of the third capacitor, the first plate of the third capacitor also being coupled to a seventh switch which is also coupled to the output of the third stage, the control unit providing at least one clocking signal to selectively open and close the first, second third, fourth, fifth, and sixth switches to control operation of the charge pump.

2. The system of claim 1, the first and second inputs of the first and second stages being coupled to the output of the transducer so that the first voltage is provided to both the first and second inputs of the first and second stages of the charge pump.

3. The system of claim 2, the first, second and third capacitors each being configured to store an electrical charge.

4. The system of claim 1, wherein the second and third voltages are each about twice the first voltage.

5. The system of claim 1, wherein the fourth voltage is about four times the first voltage.

6. The system of claim 1, wherein the energy transducer includes at least one of a photovoltaic cell, a thermoelectric generator, and a fuel cell.

7. The system of claim 1, wherein the energy storage device includes at least one of an energy buffer, a rechargeable battery, and at least one capacitor.

8. The system of claim 1, wherein the control unit generates first and second non-overlapping clocking signals, the first clocking signal being supplied to the first, fifth, and sixth switches, and the second clocking signal being supplied to the second, third, fourth, and seventh switches to control operation of the charge pump.

9. The system of claim 1, wherein the second plate of the first capacitor is coupled through an eighth switch to ground, the second plate of the second capacitor is coupled through a ninth switch to ground, and the second plate of the third capacitor is coupled through a tenth switch to ground.

10. The system of claim 9, wherein the control unit generates first and second non-overlapping clocking signals, the first clocking signal being supplied to the first, fifth, sixth, and eighth switches, and the second clocking signal being supplied to the second, third, fourth, seventh, ninth, and tenth switches to control operation of the charge pump.

11. A power converter for an energy harvesting system of a micro-scale electronic device, the power converter being configured to transfer electrical energy from an energy transducer to an energy storage device, the power converter comprising:

a control unit configured to provide at least one clocking signal; and a charge pump coupled to the control unit, the charge pump including a first stage, a second stage, and a third stage;

the first stage of the charge pump including first and second inputs, the first input of the first stage being coupled to a first plate of a first capacitor through a first switch, and the second input of the first stage being coupled to a second, opposite plate of the first capacitor through a second switch, the first plate of the first capacitor also being coupled to a third switch which is also coupled to an output of the first stage;

the second stage of the charge pump including first and second inputs, the first input of the second stage being coupled to a first plate of a second capacitor through a fourth switch, and the second input of the second stage being coupled to a second, opposite plate of the second capacitor through a fifth switch, the first plate of the second capacitor also being coupled to a sixth switch which is also coupled to an output of the second stage;

the third stage of the charge pump including first and second inputs, the first input of the third stage being coupled to a first plate of a third capacitor, and the second input of the third stage being coupled to a second, opposite plate of the third capacitor, the first plate of the third capacitor also being coupled to a seventh switch which is also coupled to an output of the third stage; and wherein an output from the energy transducer is coupled to the first and second inputs of the first and second stages of the charge pump and the outputs of the first and second stages are coupled to the first and second inputs, respectively, of the third stage of the charge pump, an output of the third stage being coupled to the energy storage device, and wherein the at least one clocking signal from the control unit is coupled to the first, second third, fourth, fifth, and sixth switches to control operation of the charge pump so that voltages at the outputs of the first and second stages are greater than the voltage supplied by the energy transducer and a voltage at the output of the third stage is greater than the voltages at the outputs of the first and second stages.

12. The system of claim 11, wherein the control unit generates first and second non-overlapping clocking signals, the first clocking signal being supplied to the first, fifth, and sixth switches, and the second clocking signal being supplied to the second, third, fourth, and seventh switches to control operation of the charge pump.

13. The system of claim 11, wherein the second plate of the first capacitor is coupled through an eighth switch to ground, the second plate of the second capacitor is coupled through a ninth switch to ground, and the second plate of the third capacitor is coupled through a tenth switch to ground.

14. The system of claim 13, wherein the control unit generates first and second non-overlapping clocking signals, the first clocking signal being supplied to the first, fifth, sixth, and eighth switches, and the second clocking signal being supplied to the second, third, fourth, seventh, ninth, and tenth switches to control operation of the charge pump.

* * * * *